United States Patent [19]
Kuo

[11] Patent Number: 6,103,079
[45] Date of Patent: Aug. 15, 2000

[54] ANTI-LEAKAGE APPARATUS

[75] Inventor: Ching-I Kuo, Hsinchu, Taiwan

[73] Assignee: United Semiconductor Corp., Hsinchu, Taiwan

[21] Appl. No.: 09/186,999

[22] Filed: Nov. 6, 1998

[30] Foreign Application Priority Data

Aug. 24, 1998 [TW] Taiwan ................................ 87113891

[51] Int. Cl.[7] ................................................ C23C 14/34
[52] U.S. Cl. ................................ 204/298.07; 204/298.03; 204/298.09; 48/193; 48/194; 137/455; 137/456; 137/461
[58] Field of Search ................................ 204/298.03, 298.07, 204/298.09; 48/193, 194; 137/455, 456, 461

[56] References Cited

U.S. PATENT DOCUMENTS

| | | | |
|---|---|---|---|
| 3,908,461 | 9/1975 | Turpen | 73/398 AR |
| 5,885,358 | 3/1999 | Maydan et al. | 118/723 R |
| 5,942,089 | 8/1999 | Sproul et al. | 204/192.13 |
| 5,951,834 | 9/1999 | Satoh | 204/298.03 |

OTHER PUBLICATIONS

JP 3–166366 abstract, Jul. 1991.

*Primary Examiner*—Nam Nguyen
*Assistant Examiner*—Steven H. VerSteeg
*Attorney, Agent, or Firm*—Thomas, Kayden, Horstemeyer & Risley

[57] ABSTRACT

An anti-microleakage apparatus is used in a sputtering deposition equipment. A metallic object, such as a wafer, is put in a process chamber. A cryo-pump is used to vacuumed the process chamber. A heater to heat up the process chamber to allow a thermal reaction. The heater is movable and is coupled to an inner bellows line, which allows a low pressure gas can be flushed into the process chamber. The anti-microleakage apparatus is formed on the inner bellows line by wrapping the inner bellows line with an outer bellows line. A higher pressure is created between the inner bellows line and the outer bellow line by filling in a gas. A pressure meter is coupled to the outer bellows line so as to monitor the actual pressure of the higher pressure. When microleakage occurs, the information cab obtained by the pressure meter.

16 Claims, 1 Drawing Sheet

ANTI-LEAKAGE APPARATUS

CROSS-REFERENCE TO RELATED APPLICATION

This application claims the priority benefit of Taiwan application serial no. 87113891, filed Aug. 24, 1998, the full disclosure of which is incorporated herein by reference.

BACKGROUND OF THE INVENTION

1. Field of the Invention

This invention relates to an sputtering deposition equipment used in semiconductor fabrication, and more particularly to an anti-microleakage apparatus used in a sputtering deposition equipment in order to prevent microleakage from occurring.

2. Description of Related Art

In semiconductor fabrication, a metal-oxide semiconductor (MOS) structure is usually composed of multiple thin layers, each of which includes different material and thickness. A technology to form these thin layers is so called thin film deposition and thin film growth. The word of deposition means that the formation of the thin layers consumes no material on substrate, which may include only the primary semiconductor substrate or a few more films, such as a silicon oxide layer, already formed.

About the deposition technology, it can be traced back to the early stage that was evaporation deposition. Nowadays, it has been developed into two categories: physical vapor deposition (PVD) and chemical vapor deposition (CVD). The words of physical and chemical characterize the technologies by words themselves.

The PVD technology further includes evaporation deposition and sputtering deposition. The evaporation deposition includes heating up an evaporative material to form a saturated vapor with high temperature and depositing the saturated vapor onto a wafer. The sputtering deposition includes producing plasma ions by bombarding a target, which also serves as an electrode and includes the desired material to be deposited, and drifting ions onto a wafer, which is put on the other electrode to attract plasma ions.

The evaporation deposition can only be used for a material with low melting point, such as aluminum so that the PVD process usually employs sputtering deposition. FIG. 1, is a cross-sectional view of a conventional sputtering deposition equipment. In FIG. 1, a sputtering deposition equipment includes a cryo-pump 10, a process chamber 12, a bellows line, a gate valve 16, and a heater 18.

During performing a metal sputtering deposition process, a tolerance of impurity, such as $O_2$ or $H_2O$, is poor so that the process chamber 12 is vacuumed by the cryo-pump 10 to clear out all residual oxidizer gas before sputtering process is performed. This pressure before sputtering process is called base pressure, which usually is about $10^{-7}$–$10^{-8}$ torrs.

After the process chamber 12 is vacuumed, a gas is flushed in from the bellows line 14. A heavier noble gas, such as argon, is preferred. In addition, in order to have a better step coverage performance for a metal layer, it is necessary to heat up the wafer to increase mobility of the metal atoms on the wafer surface. The heater 18 is used for this purpose to obtain a temperature of 350° C.–400° C. The heater 18 can move up and sown in accordance with the bellows line 14, which is extendable.

However, since the bellows line 14 is wrapped by steel lines shown in cross mark, when the bellows line 14 moves up and down, a friction from the steel lines naturally occurs. Particularly, the friction may cause a microleakage at the junction between the bellows line 14 and the heater 18. The microleakage can affect the inner pressure of the process chamber 12. A pressure of $10^{-8}$ torrs may not be normally maintained. If a large variance occurs, such as over $10^{-5}$ torrs, the gate valve 16 then automatically closes and results in a stop of the sputtering process. If the microleakage occurs, a pressure of, for example, $10^{-6}$ torrs may exist. At this pressure level, the sputtering deposition equipment does not trigger a warning to an operator, the abnormal pressure status leaves unnoted. It can cause a failure of a large number of wafers in processing.

In conclusion of above descriptions, microleakage in the conventional sputtering deposition equipment may occur and leave it unnoted. This can cause a failure of a large number of wafers in processing.

SUMMARY OF THE INVENTION

It is therefore an objective of the present invention to provide an anti-microleakage apparatus included in a sputtering deposition equipment to avoid microleakage to be unnoted. The anti-microleakage apparatus uses an outer bellow line to wrap an inner bellow line. The inner bellow line performs its purpose as usual. The outer bellow line is used to take the place of the steel lines of the conventional one. Moreover, a lighter gas with low adhesion property is filled in between the inner bellows line and the outer bellows line so as to produce an alarm once microleakage occurs and abruptly increases the pressure of the filled gas. A pressure meter is further included to measure the actual variance of the pressure created between the inner bellows line and the outer bellows line.

In accordance with the foregoing and other objectives of the present invention, an anti-microleakage apparatus included in a sputtering deposition equipment is provided. The sputtering deposition. A gate valve coupled to the process chamber is used to determine whether the sputtering deposition is performed of not. A cryo-pump coupled to the gate valve is used to form a base pressure in the process chamber. A heater coupled to the process chamber is used to heat up the process chamber to allow a thermal reaction. An inner bellows line coupled to the heater is used to supply a low pressure gas from the other end of the inner bellows line.

The anti-microleakage apparatus includes, an outer bellows line wrapping at least a portion of the inner bellows line and the junction between the inner bellows line and the heater. The inner bellows line is preferred to be fully enclosed. A gas is filled in between the inner bellows line and the outer bellows line to produce a higher pressure gas. A pressure meter is coupled to the outer bellows line to allow the pressure of the higher pressure gas to be actually measured. If microleakage occurs on the inner bellows line, the higher pressure gas can enter into the process chamber because of occurring microleakage. The base pressure is thereby increased and triggers a stop of sputtering deposition in time. If microleakage occurs on the outer bellows line, the atmospheric air with one atmospheric pressure can enter to the higher pressure gas to change its pressure. This pressure change can be monitored by the pressure meter.

BRIEF DESCRIPTION OF DRAWINGS

The invention can be more fully understood by reading the following detailed description of the preferred embodiment, with reference made to the accompanying drawings as follows.

DETAILED DESCRIPTION OF PREFERRED EMBODIMENT

Figure 2:
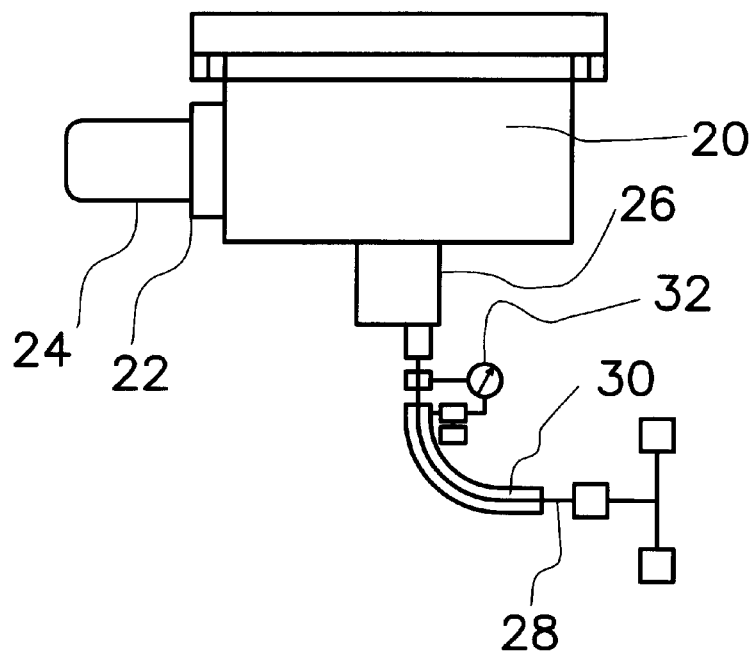
FIG. 2 is a cross-sectional view, schematically illustrating a sputtering deposition equipment including an anti-microleakage apparatus, according to a preferred embodiment of the invention.

FIG. 2 is a cross-sectional view, schematically illustrating a sputtering deposition equipment including an anti-microleakage apparatus, according to a preferred embodiment of the invention. In FIG. 2, an improved sputtering deposition equipment includes a process chamber 20, a gate valve 22, a cryo-pump 24, a heater 26, an inner bellows line 28, and an anti-microleakage apparatus, which further includes an outer bellows line 30 and a pressure meter 32. The gate valve 22 is coupled to process chamber 20. The cryo-pump 24 is coupled to the gate valve 22. The heater 26 is coupled to the process chamber 20. One end of the inner bellows line 28 is coupled to the heater. The outer bellows line 30 encloses the inner bellows line 28. The pressure meter 32 is coupled to the outer bellows line 30 and reaches to a region between the inner bellows line 28 and the outer bellows line 30.

In a conventional process, since the tolerance of impurity, such as $O_2$ or $H_2O$, is poor during the sputtering deposition process, the process chamber 20 is vacuumed by the cryo-pump 24 to clear out all residual oxidizer gas before sputtering deposition is performed. This pressure before sputtering deposition process is called base pressure, which usually is about $10^{-7}$–$10^{-8}$ torrs.

After the process chamber 20 is vacuumed, a gas is flushed in from the other end of the bellows line 28. A heavier noble gas, such as argon, is preferred. In addition, in order to have a better step coverage performance of a metal layer to be formed on a wafer, it is necessary to heat up the process chamber to increase mobility of the metal atoms on the wafer surface to allow some thermal reactions that are involved in the sputtering deposition process. The heater 26 is used for this purpose to obtain a temperature of 350° C.–400° C. in the process chamber 20. The heater 26 can move up and down in accordance with the inner bellows line 28, which is extendable.

Figure 1:
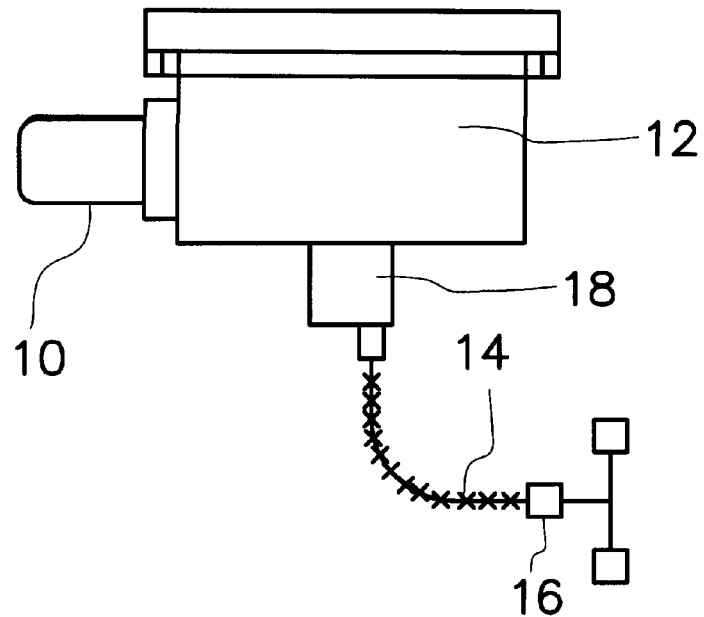
FIG. 1 is a cross-sectional view, schematicaly illustrating a conventional sputtering deposition equipment.

Up to this stage, the sputtering deposition equipment is similar to the conventional one shown in FIG. 1. If a microleakage of pressure occurs to cause a variance of an inner pressure in the process chamber 20, there is no way to know about it so far. Particularly, since the heater 26 and the inner bellows line 28 is moving, the junction between the bellows line 28 and the heater 26 has higher probability to get microleakage. The microleakage can affect the inner pressure of the process chamber 20 and cause a failure of a large number of wafers in processing. In order to solve microleakage, an anti-leakage apparatus including the outer bellows line 30 and the pressure meter 32 is proposed.

The outer bellows line 30 incloses at least a portion of the inner bellows line 28 and the junction portion to form a sub-space, which is filled with lighter noble gas, such as helium, with a higher pressure that is higher than the inner pressure in the process chamber 20. The light noble gas, such as helium gas, has a property of low adhesion to the cryo-pump 24 so that the helium gas can not be condensed out. The inner bellows line 28 is preferred to be fully enclosed by the outer bellows line 30. The inner pressure is basically maintained as low as the base pressure. The pressure meter 32 intrudes into the sub-space to be able to measure the higher pressure inside the sub-space. When microleakage occurs on the inner bellows line 28 or at its junction with the heater 26, the gas in the sub-space with the higher pressure can enter into the process chamber 20 to cause the inner pressure to be higher than $10^{-5}$ torrs, which can trigger a stop of the sputtering deposition process to avoid a damage on the wafers in processing. The actual pressure of the higher pressure in the sub-space can be monitored by the pressure meter 32. An operator can obtain pressure information of the sputtering deposition equipment to ensure deposition is normally performed.

Moreover, if microleakage occurs on the outer bellows line 30, the atmospheric air with one atmospheric pressure can abruptly increase the higher pressure in the sub-space. This also can be noted by the pressure meter 32.

In conclusion, the invention includes an anti-microleakage apparatus into a conventional sputtering depositing equipment at the inner bellows line 28 and its junction with the heater 26. The sub-space between the outer bellows line 30 and the inner bellows line provides a pressure buffer to stop the operation the equipment in time if microleakage of the inner pressure of the process chamber 20 occurs. The pressure of the sub-space is also monitored by the pressure meter 32.

The invention has been described using an exemplary preferred embodiment. However, it is to be understood that the scope of the invention is not limited to the disclosed embodiment. On the contrary, it is intended to cover various modifications and similar arrangements. The scope of the claim, therefore, should be accorded the broadest interpretations so as to encompass all such modifications and similar arrangement.

What is claimed is:

1. A sputtering deposition equipment comprising:

a process chamber for processing sputtering deposition;

a gate valve, coupled to the process chamber, and used to determine whether the sputtering deposition is preformed or not;

a cryo-pump, coupled to the gate valve, used to vacuum the process chamber to form an inner pressure in the process chamber;

a heater, coupled to the process chamber, and used to heat up the process chamber to allow a thermal reaction;

an inner bellows line, coupled to the heater at a first end, and used to supply a low pressure gas from a second end of the inner bellows line;

an outer bellows line enclosing at least a portion of the inner bellows line and a junction between the inner bellows line and the heater in order to form a sub-space between the inner bellows line and outer bellows line, wherein the sub-space is filled with a lighter gas having a higher pressure which is higher than the inner pressure; and a pressure meter, coupled to the outer bellows line and intruding into the sub-space so as to allow the higher pressure to be actually measured and monitored, wherein when microleakage of the inner pressure occurs, the higher pressure in the sub-space can increase the inner pressure over a threshold pressure, which can trigger a stop of sputtering deposition process, and when microleakage of the higher pressure occurs, a pressure of an environment of the equipment can change the higher pressure in the sub-space.

2. The equipment of claim 1, wherein the low pressure gas supplied from the inner bellows line comprises argon.

3. The equipment of claim 1, wherein the lighter gas filled into sub-space comprises helium.

4. The equipment of claim 1, wherein the lighter gas comprises a low adhesion ability to the cryo-pump so that a extra pressure contributed from the lighter gas to the inner pressure is not condensed out.

5. The equipment of claim 1, wherein the environment of the equipment is the atmosphere.

6. The equipment of claim 1, wherein the cryo-pump vacuums the process chamber before a sputtering deposition process being performed so as to form the inner pressure.

7. The equipment of claim 6, wherein the inner pressure is about $10^{-8}$ torrs.

8. The equipment of claim 1, wherein the higher pressure of the sub-space is between the inner pressure and the pressure of the environment.

9. An anti-microleakage apparatus used in a sputtering deposition equipment, wherein the equipment comprises a process chamber for processing sputtering deposition; a gate valve coupled to the process chamber so as to determine whether the sputtering deposition is performed or not; a cryo-pump coupled to the gate valve so as to vacuum the process chamber to form an inner pressure in the process chamber; a heater coupled to the process chamber so as to heat up the process chamber to allow a thermal reaction; an inner bellows line coupled to the heater at a first end so as to supply a low pressure gas from a second end of the inner bellows line, the anti-microleakage apparatus comprising:

an outer bellows line enclosing at least a portion of the inner bellows line and a junction between the inner bellows line and the heater in order to form a sub-space between the inner bellows line and outer bellows line, wherein the sub-space is filled with a lighter gas having a higher pressure which is higher than the inner pressure; and a pressure meter, coupled to the outer bellows line and intruding into the sub-space so as to allow the higher pressure to be actually measured and monitored, wherein when microleakage of the inner pressure occurs, the higher pressure in the sub-space can increase the inner pressure over a threshold pressure, which can trigger a stop of sputtering deposition process, and when microleakage of the higher pressure occurs, a pressure of an environment of the equipment can change the higher pressure in the sub-space.

10. The equipment of claim 9, wherein the low pressure gas supplied from the inner bellows line comprises argon.

11. The equipment of claim 9, wherein the lighter gas filled into sub-space comprises helium.

12. The equipment of claim 9, wherein the lighter gas comprises a low adhesion ability to the cryo-pump so that a extra pressure contributed from the lighter gas to the inner pressure is not condensed out.

13. The equipment of claim 9, wherein the environment of the equipment is the atmosphere.

14. The equipment of claim 9, wherein the cryo-pump vacuums the process chamber before a sputtering deposition process being preformed so as to form the inner pressure.

15. The equipment of claim 14, wherein the inner pressure is about $10^{-8}$ torrs.

16. The equipment of claim 9, wherein the higher pressure of the sub-space is between the inner pressure and the pressure of the environment.

* * * * *